(12) United States Patent
Tong et al.

(10) Patent No.: US 11,532,802 B2
(45) Date of Patent: Dec. 20, 2022

(54) DISPLAY PANEL AND MANUFACTURING METHOD THEREOF, DISPLAY DEVICE

(71) Applicant: BOE TECHNOLOGY GROUP CO., LTD., Beijing (CN)

(72) Inventors: Hui Tong, Beijing (CN); Yongfa Dong, Beijing (CN); Qing Wang, Beijing (CN); Kuanta Huang, Beijing (CN)

(73) Assignee: Beijing BOE Technology Development Co., Ltd., Beijing (CN)

( * ) Notice: Subject to any disclaimer, the term of this patent is extended or adjusted under 35 U.S.C. 154(b) by 298 days.

(21) Appl. No.: 16/772,937

(22) PCT Filed: Aug. 23, 2019

(86) PCT No.: PCT/CN2019/102314
§ 371 (c)(1),
(2) Date: Jun. 15, 2020

(87) PCT Pub. No.: WO2021/035420
PCT Pub. Date: Mar. 4, 2021

(65) Prior Publication Data
US 2022/0131109 A1    Apr. 28, 2022

(51) Int. Cl.
*H01L 51/52*     (2006.01)
*H01L 27/32*     (2006.01)
*H01L 51/56*     (2006.01)

(52) U.S. Cl.
CPC ........ *H01L 51/5271* (2013.01); *H01L 27/322* (2013.01); *H01L 27/3258* (2013.01);
(Continued)

(58) Field of Classification Search
None
See application file for complete search history.

(56) References Cited

U.S. PATENT DOCUMENTS 3,772,766 A   11/1973  Ebendt et al.
5,592,318 A    1/1997  Majima et al.
(Continued)

FOREIGN PATENT DOCUMENTS

CN      1530878 A    9/2004
CN    101192382 A    6/2008
(Continued)

OTHER PUBLICATIONS

English translation of the International Search Report of PCT/CN2016/101999, dated Jan. 18, 2017.
(Continued)

*Primary Examiner* — Michelle Mandala
(74) *Attorney, Agent, or Firm* — Collard & Roe, P.C.

(57) ABSTRACT

Disclosed are a display panel, a manufacturing method thereof, and a display device. The display panel includes a base substrate and sub-pixels thereon. At least one sub-pixel includes: a light emitting element including a first electrode, a luminous functional layer and a second electrode sequentially stacked, the first electrode being closer to the base substrate than the second electrode; a metal reflective layer, between the base substrate and the first electrode; a silicon nitride layer, between the first electrode and the metal reflective layer, and including a first via hole through which the first electrode is connected with the metal reflective layer; a driving circuit including a driving transistor and a storage capacitor between the base substrate and the metal reflective layer, the driving transistor including a gate electrode connected with the storage capacitor, and source and drain electrodes, one of which is connected with the metal reflective layer.

20 Claims, 5 Drawing Sheets

(52) U.S. Cl.
CPC ...... *H01L 51/5206* (2013.01); *H01L 51/5234* (2013.01); *H01L 51/56* (2013.01); *H01L 2227/323* (2013.01); *H01L 2251/308* (2013.01); *H01L 2251/5315* (2013.01); *H01L 2251/556* (2013.01); *H01L 2251/558* (2013.01)

(56) References Cited

U.S. PATENT DOCUMENTS

| | | | |
|---|---|---|---|
| 5,898,322 | A | 4/1999 | Kubota et al. |
| 5,960,268 | A | 9/1999 | Aihara |
| 6,040,208 | A | 3/2000 | Honeycutt et al. |
| 6,274,421 | B1 | 8/2001 | Hsu et al. |
| 6,580,094 | B1 | 6/2003 | Yamazaki et al. |
| 7,361,534 | B2 | 4/2008 | Pelella |
| 7,432,146 | B2 | 10/2008 | Yamamoto |
| 7,733,359 | B1 | 6/2010 | Hagge et al. |
| 7,838,883 | B2 | 11/2010 | Yamazaki et al. |
| 8,017,945 | B2 | 9/2011 | Yamazaki et al. |
| 9,023,678 | B2 | 5/2015 | Heo et al. |
| 9,236,408 | B2 | 1/2016 | Yamazaki |
| 9,401,112 | B2 | 7/2016 | Ohara et al. |
| 9,711,549 | B2 | 7/2017 | Yamazaki et al. |
| 9,721,509 | B2 | 8/2017 | Kim et al. |
| 9,748,292 | B2 | 8/2017 | Yamazaki |
| 9,859,439 | B2 | 1/2018 | Miyairi |
| 9,875,690 | B2 | 1/2018 | Wang et al. |
| 10,050,062 | B2 | 8/2018 | Sasagawa et al. |
| 10,147,747 | B2 | 12/2018 | Toriumi et al. |
| 10,796,641 | B2 | 10/2020 | Yang et al. |
| 11,322,082 | B2 | 5/2022 | Hu et al. |
| 2002/0084463 | A1 | 7/2002 | Sanford et al. |
| 2002/0179908 | A1 | 12/2002 | Arao |
| 2003/0025659 | A1 | 2/2003 | Kondo et al. |
| 2003/0030144 | A1 | 2/2003 | Ono et al. |
| 2003/0153155 | A1 | 8/2003 | Wang et al. |
| 2004/0189625 | A1 | 9/2004 | Sato |
| 2005/0018110 | A1 | 1/2005 | Liu |
| 2005/0173761 | A1 | 8/2005 | Takafuji et al. |
| 2005/0245046 | A1 | 11/2005 | Takafuji et al. |
| 2006/0170634 | A1 | 8/2006 | Kwak et al. |
| 2006/0205166 | A1 | 9/2006 | Ishikiriyama |
| 2007/0164290 | A1 | 7/2007 | Yamazaki et al. |
| 2007/0295961 | A1 | 12/2007 | Kim |
| 2008/0111494 | A1* | 5/2008 | Kim ............ H01L 29/458 257/E29.147 |
| 2008/0142807 | A1 | 6/2008 | Choe et al. |
| 2008/0169757 | A1 | 7/2008 | Chang et al. |
| 2008/0191603 | A1 | 8/2008 | Kubota |
| 2008/0210928 | A1 | 9/2008 | Abe et al. |
| 2009/0114926 | A1 | 5/2009 | Yamazaki |
| 2009/0152625 | A1 | 6/2009 | Lee et al. |
| 2010/0025664 | A1 | 2/2010 | Park |
| 2010/0289732 | A1 | 11/2010 | Ina et al. |
| 2011/0233553 | A1 | 9/2011 | Sakakura et al. |
| 2011/0260951 | A1 | 10/2011 | Hwang et al. |
| 2011/0291550 | A1 | 12/2011 | Kim et al. |
| 2012/0007848 | A1 | 1/2012 | Han et al. |
| 2012/0039034 | A1 | 2/2012 | Jepsen et al. |
| 2012/0105421 | A1 | 5/2012 | Tsai et al. |
| 2012/0235973 | A1 | 9/2012 | Yoo |
| 2013/0001601 | A1 | 1/2013 | Lee et al. |
| 2013/0328753 | A1 | 12/2013 | Tsuge |
| 2014/0034982 | A1 | 2/2014 | Yamazaki |
| 2014/0131717 | A1 | 5/2014 | Qi et al. |
| 2014/0159042 | A1 | 6/2014 | Song et al. |
| 2014/0252321 | A1 | 9/2014 | Pyon et al. |
| 2014/0299867 | A1 | 10/2014 | Ono et al. |
| 2014/0312334 | A1 | 10/2014 | Yamazaki et al. |
| 2014/0353641 | A1* | 12/2014 | Takahashi ............ H05K 1/189 257/40 |
| 2014/0361276 | A1 | 12/2014 | Hsu et al. |
| 2014/0367652 | A1 | 12/2014 | Cho et al. |
| 2015/0108470 | A1 | 4/2015 | Yamazaki et al. |
| 2015/0108475 | A1 | 4/2015 | Ando et al. |
| 2015/0115224 | A1 | 4/2015 | Kou |
| 2015/0270326 | A1 | 9/2015 | Hekmatshoartabari et al. |
| 2015/0348997 | A1 | 12/2015 | Sasagawa et al. |
| 2016/0126296 | A1 | 5/2016 | Feng |
| 2016/0172431 | A1 | 6/2016 | Huang et al. |
| 2016/0181350 | A1 | 6/2016 | Lee |
| 2016/0275870 | A1 | 9/2016 | Kimura et al. |
| 2016/0327842 | A1 | 11/2016 | Qiao et al. |
| 2016/0351589 | A1 | 12/2016 | Sasagawa et al. |
| 2016/0357076 | A1 | 12/2016 | Huangfu et al. |
| 2016/0372711 | A1 | 12/2016 | Song et al. |
| 2017/0047004 | A1 | 2/2017 | Yoon et al. |
| 2017/0092707 | A1 | 3/2017 | Wang |
| 2017/0193879 | A1 | 7/2017 | Wang |
| 2017/0236885 | A1 | 8/2017 | Koshihara et al. |
| 2017/0294491 | A1 | 10/2017 | Jo et al. |
| 2017/0301293 | A1 | 10/2017 | Zhu et al. |
| 2018/0088260 | A1 | 3/2018 | Jin et al. |
| 2018/0102092 | A1 | 4/2018 | Kubota et al. |
| 2018/0151827 | A1 | 5/2018 | Kang et al. |
| 2018/0212011 | A1 | 7/2018 | Lai et al. |
| 2019/0066564 | A1 | 2/2019 | Tan |
| 2019/0251905 | A1 | 8/2019 | Yang et al. |
| 2019/0386074 | A1 | 12/2019 | Li et al. |
| 2020/0082757 | A1 | 3/2020 | Yuan et al. |
| 2020/0279540 | A1 | 9/2020 | Wang |
| 2021/0233968 | A1 | 7/2021 | Yang et al. |

FOREIGN PATENT DOCUMENTS

| | | |
|---|---|---|
| CN | 101833186 A | 9/2010 |
| CN | 101980330 A | 2/2011 |
| CN | 102760841 A | 10/2012 |
| CN | 102983155 A | 3/2013 |
| CN | 103022079 A | 4/2013 |
| CN | 203026507 U | 6/2013 |
| CN | 103403787 A | 11/2013 |
| CN | 103440840 A | 12/2013 |
| CN | 103515413 A | 1/2014 |
| CN | 104025707 A | 9/2014 |
| CN | 104201190 A | 12/2014 |
| CN | 104240633 A | 12/2014 |
| CN | 104299572 A | 1/2015 |
| CN | 104332561 A | 2/2015 |
| CN | 104380368 A | 2/2015 |
| CN | 104597655 A | 5/2015 |
| CN | 104681624 A | 6/2015 |
| CN | 105185816 A | 12/2015 |
| CN | 105225633 A | 1/2016 |
| CN | 105280139 A | 1/2016 |
| CN | 204966501 U | 1/2016 |
| CN | 105304679 A | 2/2016 |
| CN | 205355055 U | 6/2016 |
| CN | 106159100 A | 11/2016 |
| CN | 205789046 U | 12/2016 |
| CN | 106601167 A | 4/2017 |
| CN | 106782307 A | 5/2017 |
| CN | 107086237 A | 8/2017 |
| CN | 107103878 A | 8/2017 |
| CN | 107393468 A | 11/2017 |
| CN | 107424570 A | 12/2017 |
| CN | 107591125 A | 1/2018 |
| CN | 107768385 A | 3/2018 |
| CN | 107799577 A | 3/2018 |
| CN | 109036279 A | 12/2018 |
| CN | 109215549 A | 12/2018 |
| CN | 109119027 A | 1/2019 |
| CN | 109509430 A | 3/2019 |
| CN | 109904347 A | 6/2019 |
| CN | 110071229 A | 7/2019 |
| EP | 1 096 571 A2 | 5/2001 |
| EP | 2 680 310 A1 | 1/2014 |
| JP | H06-347828 A | 12/1994 |
| JP | 2000-315734 A | 11/2000 |
| JP | 2001-195016 A | 7/2001 |
| JP | 2001-332383 A | 11/2001 |
| JP | 2007-156058 A | 6/2007 |
| JP | 2008-153191 A | 7/2008 |
| JP | 2009-003435 A | 1/2009 |
| JP | 2009-016410 A | 1/2009 |

(56) References Cited

FOREIGN PATENT DOCUMENTS

| | | |
|---|---|---|
| JP | 2009-036948 A | 2/2009 |
| JP | 2011-181938 A | 9/2011 |
| KR | 10-2008-0101732 A | 11/2008 |
| KR | 10-1645404 B1 | 8/2016 |
| KR | 10-2017-0005252 A | 1/2017 |
| RU | 2 453 879 C2 | 6/2012 |

OTHER PUBLICATIONS

English translation of the Notice of Transmittal of the International Search Report of PCT/CN2016/101999, dated Jan. 18, 2017.
International Preliminary Report on Patentability of PCT/CN2016/101999, issuance date Apr. 17, 2018 and English Translation of the Written Opinion of the International Searching Authority of PCT/CN2016/101999, dated Jan. 18, 2017.
International Search Report of PCT/CN2019/102314 in Chinese, dated May 27, 2020, with English translation.
Notice of Transmittal of the International Search Report of PCT/CN2019/102314 in Chinese, dated May 27, 2020.
Written Opinion of the International Searching Authority of PCT/CN2019/102314 in Chinese, dated May 27, 2020 with English translation.
International Search Report of PCT/CN2019/102293 in Chinese, dated Apr. 26, 2020, with English translation.
Notice of Transmittal of the International Search Report of PCT/CN2019/102293 in Chinese, dated Apr. 26, 2020.
Written Opinion of the International Searching Authority of PCT/CN2019/102293 in Chinese, dated Apr. 26, 2020 with English translation.
International Search Report of PCT/CN2019/102307 in Chinese, dated May 26, 2020, with English translation.
Notice of Transmittal of the International Search Report of PCT/CN2019/102307 in Chinese, dated May 26, 2020.
Written Opinion of the International Searching Authority of PCT/CN2019/102307 in Chinese, dated May 26, 2020 with English translation.
International Search Report of PCT/CN2019/102819 in Chinese, dated May 26, 2020, with English translation.
Notice of Transmittal of the International Search Report of PCT/CN2019/102819 in Chinese, dated May 26, 2020.
Written Opinion of the International Searching Authority of PCT/CN2019/102819 in Chinese, dated May 26, 2020 with English translation.
Non-Final Office Action in U.S. Appl. No. 15/521,612 dated Jul. 6, 2018.
Non-Final Office Action in U.S. Appl. No. 15/521,612 dated Mar. 29, 2019.
Final Office Action in U.S. Appl. No. 15/521,612 dated Jan. 14, 2019.
Final Office Action in U.S. Appl. No. 15/521,612 dated Oct. 1, 2019.
Notice of Allowance in U.S. Appl. No. 16/234,777, dated Sep. 1, 2020.
Non-Final Office Action in U.S. Appl. No. 16/492,930 dated Jul. 24, 2020.
English translation of Extended European Search Report in EP Application No. 16852868.5 dated May 9, 2019.
English translation of Extended European Search Report in EP Application No. 17768339.8 dated Dec. 6, 2019.
Korean Office Action in Korean Application No. 10-2017-7009789, dated Aug. 20, 2018 with English translation.
Korean Notice of Allowance in Korean Application No. 10-2019-7009729, dated May 8, 2019 with English translation.
Japanese Search Report in Japanese Application No. 2017-521204 dated Apr. 1, 2020 with English translation.
Japanese Office Action in Japanese Application No. 2017-521204, dated Jun. 8, 2020 with English translation.
Russian Notice of Allowance in Russian Application No. 2019130488, dated Mar. 18, 2020 with English Translation.
Chinese Office Action in Chinese Application No. 201810135947.1, dated Mar. 3, 2020 with English translation.
First Office Action in U.S. Appl. No. 16/959,398 dated Nov. 26, 2021.
First Office Action in U.S. Appl. No. 16/812,619 dated Jan. 7, 2022.
U.S. Office Action in U.S. Appl. No. 16/916,671 dated Feb. 24, 2022.
First Indian Office Action in Indian Application No. 202017056357 dated Mar. 29, 2022 with English translation.
First Indian Office Action in Indian Application No. 202017056072 dated Apr. 7, 2022 with English translation.
U.S. Office Action in U.S. Appl. No. 16/814,119 dated Apr. 20, 2022.
Japanese Office Action in Japanese Application No. 2017-521204, dated Jan. 20, 2021 with English translation.
Chinese Office Action in Application No. 201980001452.2 dated May 11, 2022 with English translation.
Final Office Action in U.S. Appl. No. 16/812,619 dated May 16, 2022.
Non-Final Office Action in U.S. Appl. No. 16/959,757 dated May 27, 2022.
Extended European Search Report in European Patent Application No. 19931503.7 dated May 30, 2022.
Chinese Office Action in Chinese Application No. 201980001517.3 dated Sep. 1, 2021 with English translation.
U.S. Office Action in U.S. Appl. No. 16/916,671 dated Oct. 1, 2021.
Extended European Search Report in European Application No. 19932239.7 dated Aug. 1, 2022.
Extended European Search Report in European Application No. 19933232.1 dated Sep. 6, 2022.

\* cited by examiner

DISPLAY PANEL AND MANUFACTURING METHOD THEREOF, DISPLAY DEVICE

CROSS REFERENCE TO RELATED APPLICATIONS

This application is the National Stage of PCT/CN2019/102314 filed on Aug. 23, 2019, the disclosure of which is incorporated by reference.

TECHNICAL FIELD

The embodiments of the present disclosure relate to a display panel and a manufacturing method thereof, and a display device.

BACKGROUND

Organic light-emitting diode (OLED) display panels have advantages of thin thickness, light weight, wide viewing angle, active light emission, continuous adjustability of luminous color, low cost, fast respond speed, low power consumption, low driving voltage, wide working temperature range, simple production process, high luminous efficiency and being suitable for flexible display, etc., and have been more and more widely used in the display fields such as mobile phones, tablet computers, digital cameras, etc.

SUMMARY

At least one embodiment of the present disclosure provides a display panel, which includes a base substrate and a plurality of sub-pixels on one side of the base substrate, wherein at least one of the plurality of sub-pixels includes: a light emitting element, including a first electrode, a luminous functional layer and a second electrode that are sequentially stacked, wherein the first electrode is closer to the base substrate than the second electrode; a metal reflective layer between the base substrate and the first electrode; a silicon nitride layer between the first electrode and the metal reflective layer, wherein the silicon nitride layer is in direct contact with the metal reflective layer, the silicon nitride layer includes a first via hole, and the first electrode is electrically connected with the metal reflective layer through the first via hole; and a driving circuit between the base substrate and the metal reflective layer, wherein the driving circuit includes a driving transistor and a storage capacitor, the driving transistor includes a source electrode, a drain electrode and a gate electrode, one of the source electrode and the drain electrode is electrically connected with the metal reflective layer, the gate electrode is electrically connected with the storage capacitor, and the storage capacitor is configured to store a data signal.

For example, in the display panel provided by some embodiments of the present disclosure, a deposition temperature of the silicon nitride layer is in the range of 70-100 degrees Celsius.

For example, in the display panel provided by some embodiments of the present disclosure, the deposition temperature of the silicon nitride layer is in a range of 80-85 degrees Celsius.

For example, in the display panel provided by some embodiments of the present disclosure, a thickness of the silicon nitride layer is in a range of 50-100 Å.

For example, in the display panel provided by some embodiments of the present disclosure, a material of the metal reflective layer includes a metallic material containing silver or aluminum.

For example, in the display panel provided by some embodiments of the present disclosure, a thickness of the metal reflective layer is in a range of 300-500 Å.

For example, in the display panel provided by some embodiments of the present disclosure, the first electrode is a transparent electrode.

For example, in the display panel provided by some embodiments of the present disclosure, a material of the first electrode includes at least one selected from the group consisting of indium tin oxide (ITO), zinc tin oxide (IZO), indium gallium tin oxide (IGZO), and indium zinc tin oxide (IZTO).

For example, in the display panel provided by some embodiments of the present disclosure, a thickness of the first electrode is in a range of 700-2000 Å.

For example, in the display panel provided by some embodiments of the present disclosure, wherein a structure including the metal reflective layer, the silicon nitride layer and the first electrode, has a surface roughness of less than 3.0 nm.

For example, in the display panel provided by some embodiments of the present disclosure, the luminous functional layer includes one selected from the group consisting of an organic luminous functional layer, an inorganic luminous functional layer and a quantum dot luminous functional layer.

For example, in the display panel provided by some embodiments of the present disclosure, the second electrode is a transparent electrode.

For example, in the display panel provided by some embodiments of the present disclosure, a material of the second electrode includes at least one selected from the group consisting of indium tin oxide (ITO), zinc tin oxide (IZO), indium gallium tin oxide (IGZO), and indium zinc tin oxide (IZTO).

For example, the display panel provided by some embodiments of the present disclosure further includes: a first encapsulation layer, a color filter layer, a second encapsulation layer and a cover plate that are sequentially stacked and on one side of the light emitting element away from the base substrate.

For example, in the display panel provided by some embodiments of the present disclosure, the light emitting element is configured to emit white light, and the color filter layer includes a red filter unit, a green filter unit and a blue filter unit.

For example, in the display panel provided by some embodiments of the present disclosure, the base substrate is a silicon-based base substrate.

For example, the display panel provided by some embodiments of the present disclosure further includes a second via hole, wherein the one of the source electrode and the drain electrode is electrically connected with the metal reflective layer through the second via hole.

For example, the display panel provided by some embodiments of the present disclosure further includes an anti-oxidation layer, wherein the anti-oxidation layer is between the base substrate and the metal reflective layer, and the anti-oxidation layer is in direct contact with the metal reflective layer.

At least one embodiment of the present disclosure further provides a display device, which includes the display panel according to any one embodiment of the present disclosure.

At least one embodiment of the present disclosure further provides a manufacturing method of a display panel, including: providing a base substrate, wherein a driving circuit is formed on the base substrate, the driving circuit includes a driving transistor and a storage capacitor, the driving transistor includes a source electrode, a drain electrode and a gate electrode, and the gate electrode is electrically connected with the storage capacitor; forming a metal reflective layer on one side of the driving circuit away from the base substrate, and making one of the source electrode and the drain electrode be electrically connected with the metal reflective layer; forming a silicon nitride layer on one side of the metal reflective layer away from the base substrate, and forming a first via hole in the silicon nitride layer; and forming, on one side of the silicon nitride layer away from the base substrate, a light emitting element which includes a first electrode, a luminous functional layer and a second electrode that are sequentially stacked, and making the first electrode be electrically connected with the metal reflective layer through the first via hole.

For example, the manufacturing method provided by some embodiments of the present disclosure further includes: forming a second via hole on one side of the driving circuit away from the base substrate, before the forming the metal reflective layer on one side of the driving circuit away from the base substrate; wherein the one of the source electrode and the drain electrode is electrically connected with the metal reflective layer through the second via hole.

For example, the manufacturing method provided by some embodiments of the present disclosure further includes: sequentially forming a first encapsulation layer, a color filter layer, a second encapsulation layer and a cover plate on one side of the light emitting element away from the base substrate.

BRIEF DESCRIPTION OF THE DRAWINGS

In order to clearly illustrate the technical solutions of the embodiments of the disclosure, the drawings of the embodiments will be briefly described in the following; it is obvious that the described drawings are only related to some embodiments of the disclosure and thus are not limitative to the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. Also, the terms "a," "an," "the," etc., are not intended to indicate a limitation of quantity, but indicate the presence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

The present disclosure is described below with reference to several specific embodiments. In order to keep the following description of the embodiments of the present disclosure clear and concise, detailed descriptions of known functions and known components or elements may be omitted. When any one component or element of an embodiment of the present disclosure appears in more than one of the accompanying drawings, the component or element is denoted by a same or similar reference numeral in each of the drawings.

OLED display panels can generally be divided into a bottom emission type and a top emission type, according to different directions in which light beams are emitted from OLEDs. An active matrix driving mode is usually adopted by OLED display panels to drive OLEDs to emit light. In this case, compared with OLED display panels of bottom emission type, OLED display panels of top emission type can effectively improve the aperture ratio, thus being beneficial to realizing high-brightness and high-resolution display.

Different from a conventional OLED display device which adopts amorphous silicon, microcrystalline silicon, or polycrystalline silicon, etc., on a glass substrate, a silicon-based OLED display device takes a monocrystalline silicon chip as a substrate, and the pixel size thereof can be 1/10 of that of the conventional display device, such as less than 100 microns.

At least one embodiment of the present disclosure provides a display panel, which includes a base substrate and a plurality of sub-pixels located on one side of the base substrate. At least one of the plurality of sub-pixels includes: a light emitting element, including a first electrode, a luminous functional layer, and a second electrode that are sequentially stacked, wherein the first electrode is closer to the base substrate than the second electrode; a metal reflective layer, located between the base substrate and the first electrode; a silicon nitride layer, located between the first electrode and the metal reflective layer, wherein the silicon nitride layer is in direct contact with the metal reflective layer, and the silicon nitride layer includes a first via hole, and the first electrode is electrically connected with the metal reflective layer through the first via hole; and a driving circuit, located between the base substrate and the metal reflective layer, wherein the driving circuit includes a driving transistor and storage capacitor, the driving transistor includes a source electrode, a drain electrode and a gate electrode, one of the source electrode and the drain electrode is electrically connected to the metal reflective layer, the gate electrode is electrically connected with the storage capacitor, and the storage capacitor is configured to store a data signal.

Some embodiments of the present disclosure further provide a manufacturing method and a display device corresponding to the above display panel.

A structure which includes the metal reflective layer, the silicon nitride layer and the first electrode in the display panel provided by at least one embodiment of the present disclosure has a relatively small surface roughness, thereby improving the reflectivity of the metal reflective layer. Thus, the light emitting efficiency and light emitting brightness of the light emitting element can be improved, and further, the display brightness of the display panel can be improved.

Figure 1:
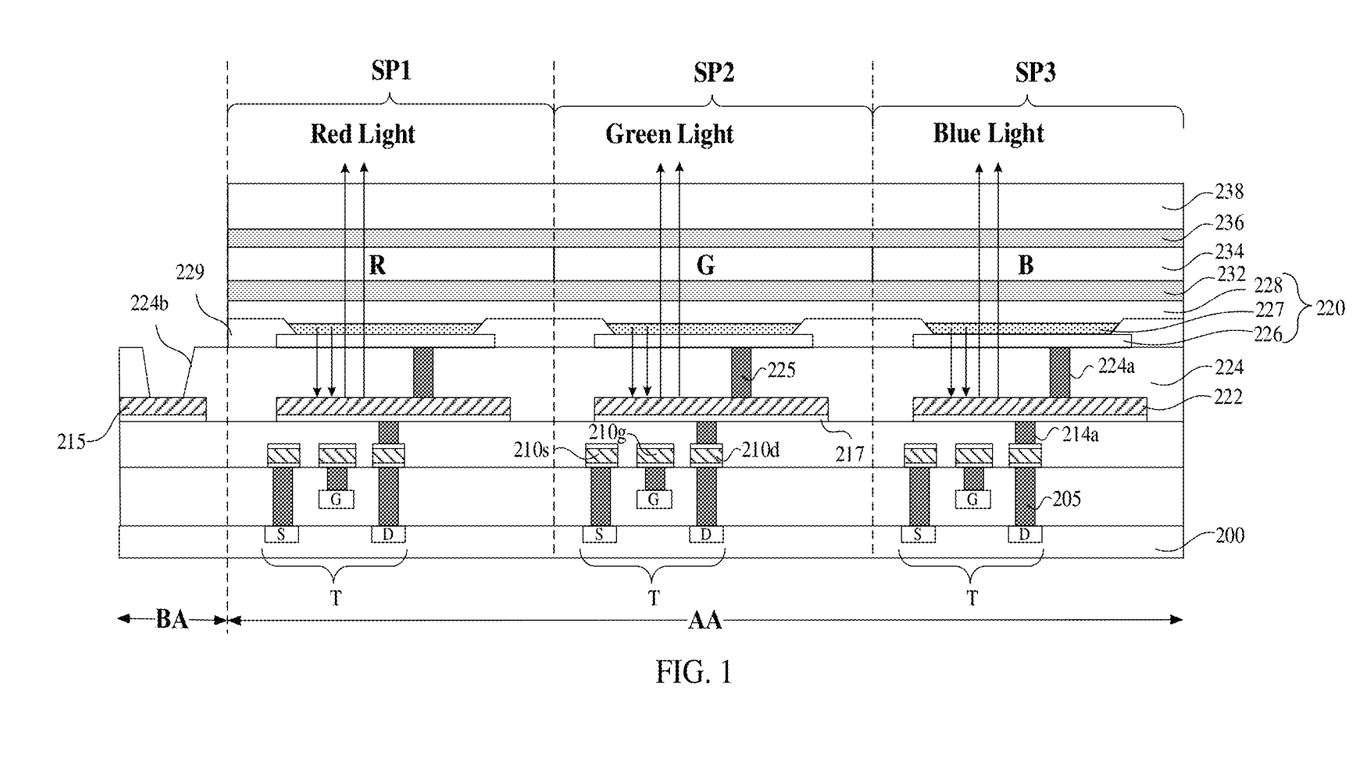
FIG. 1 is a schematic partial structural diagram of a display panel provided by at least one embodiment of the present disclosure.

FIG. 1 is a schematic partial structural diagram of a display panel provided by at least one embodiment of the present disclosure. As shown in FIG. 1, the display panel includes a base substrate 200 and a plurality of sub-pixels located on one side of the base substrate 200. For example, the base substrate 200 can be a silicon-based base substrate, and the embodiments of the present disclosure include but are not limited to this case. For example, the semiconductor manufacturing process used for the silicon-based base substrate is mature and has a stable performance, which is beneficial to manufacturing micro-display devices on the silicon-based base substrate.

For example, as shown in FIG. 1, for the display panel, three sub-pixels, namely, a red sub-pixel SP1, a green sub-pixel SP2 and a blue sub-pixel SP3 are exemplarily shown. It should be noted that, the number of sub-pixels shown in FIG. 1 is illustrative, and the embodiments of the present disclosure are not limit thereto. In addition, colors of the sub-pixels are also illustrative. For example, the plurality of sub-pixels can also include, for example, a yellow sub-pixel, a white sub-pixel, etc., and the embodiments of the present disclosure are not limit thereto.

For example, as shown in FIG. 1, each sub-pixel includes a light emitting element 220, and the light emitting element 220 includes a first electrode 226, a luminous functional layer 227, and a second electrode 228 that are sequentially stacked. For example, as shown in FIG. 1, the first electrode 226 of the light emitting element 220 is closer to the base substrate 200 than the second electrode 228 of the light emitting element 220. For example, the light emitting element 220 can be any one selected from the group consisting of an organic light-emitting diode, an inorganic light-emitting diode, and a quantum dot light-emitting diode, etc.

For example, as shown in FIG. 1, each sub-pixel further includes a metal reflective layer 222, and the metal reflective layer 222 is located between the base substrate 200 and the first electrode 226.

For example, as shown in FIG. 1, each sub-pixel further includes a silicon nitride (SiNx) layer 224, and the silicon nitride layer 224 is located between the first electrode 226 and the metal reflective layer 222. For example, as shown in FIG. 1, the silicon nitride layer 224 is in direct contact with the metal reflective layer 222, the silicon nitride layer 224 includes a first via hole 224a, and the first electrode 226 is electrically connected with the metal reflective layer 222 through the first via hole 224a.

For example, in some examples, as shown in FIG. 1, both of the first electrode 226 and the second electrode 228 are transparent electrodes. A part of light emitted by the luminous functional layer 227 can be directly emitted outward through the second electrode 228, and another part of the light emitted by the luminous functional layer 227 needs to pass through the first electrode 226 and the silicon nitride layer 224, be reflected by the metal reflective layer 222, then pass through the silicon nitride layer 224 and the first electrode 226, and finally be emitted outward through the second electrode 228. Therefore, improving the reflectivity of a reflective electrode structure formed of the metal reflective layer 222, the silicon nitride layer 224 and the first electrode 226 is helpful to improve the light emitting brightness and light emitting efficiency of the light emitting element. As for light emitted by the luminous functional layer 227, the first electrode 226 and the silicon nitride layer 224 can be considered as being transparent, and thus, improving the reflectivity of the above reflective electrode structure is mainly to improve the reflectivity of the metal reflective layer 222. On one hand, the reflectivity of the metal reflective layer 222 can be improved by selecting a metallic material with higher reflectivity to form the metal reflective layer 222; on the other hand, the reflectivity of the metal reflective layer 222 can also be improved by reducing surface roughness of a surface of the metal reflective layer 222 close to the silicon nitride layer 224 (the smaller the surface roughness is, the more similar the surface is to an ideal mirror surface, and thus the higher the reflectivity of the surface is).

For example, in some examples, in order to improve the reflectivity of the metal reflective layer 122, the material of the metal reflective layer 222 can include a metallic material with high reflectivity (e.g., a reflectivity of 90% or above is high reflectivity), which is, for example, a silver-containing metallic material such as silver (Ag), silver alloy or the like, or an aluminum-containing metallic material such as aluminum (Al), aluminum alloy or the like, and so on, so as to improve the reflectivity of the metal reflective layer 222 from the aspect of material. For example, the above metal reflective layer 222 can be formed by means of electron beam evaporation, etc. It should be noted that, due to the facts that Al has an active chemical property and is easy to be oxidized into alumina (AlOx), so that the reflectivity may be degraded and the device defects may be caused; and at the same time, Al atoms are prone to migrate and have an effect on other film layers. Therefore, Al is usually not directly used as the material of the first electrode 226 to directly contact the luminous functional layer 227.

For example, in some examples, the thickness of the metal reflective layer 222 is in the range of 300-500 Å, e.g. 360-450 Å. If the thickness of the metal reflective layer 222 is too small, its reflective effect is not obvious; and if the thickness of the metal reflective layer 222 is too large, the overall thickness of the display panel will be relatively large.

For example, in some examples, the silicon nitride layer 224 can be formed on the metal reflective layer 222 by means of vapor deposition. For example, the method of vapor deposition includes chemical vapor deposition (CVD), plasma chemical vapor deposition (PCVD), plasma enhanced chemical vapor deposition (PECVD), etc. For example, in the case where the silicon nitride layer is formed by means of vapor deposition, the deposition temperature can be relatively low. Taking that the metal reflective layer 222 is an Al reflective layer as an example, as the deposition temperature decreases, the migration of Al atoms will be inhibited, and the degree of the surface roughness of the Al reflective layer 222 becoming larger can be reduced, so as to improve the reflectivity of the metal reflective layer 222 from the aspect of structure.

For example, in some examples, as shown in FIG. 1, the silicon nitride layers 224 in the plurality of sub-pixels are formed integrally to facilitate manufacture. For example, as shown in FIG. 1, the silicon nitride layer 224 can further include an opening 224b exposing a pad 215, the arrangement of the opening 224b facilitates electrical connection and signal communication between the pad 215 and an external circuit. For example, the opening 224b exposing the pad 215 is located in a peripheral region BA.

For example, in some examples, the deposition temperature of the silicon nitride layer 224 is, for example, in the range of 70-100 degrees Celsius, and for another example, in the range of 80-85 degrees Celsius.

For example, in some examples, the thickness of the silicon nitride layer 224 is in the range of 50-100 Å, e.g. 60-80 Å. If the thickness of the silicon nitride layer 224 is too small, it may not effectively realize the functions of protecting Al from being oxidized and inhibiting the migration of Al atoms; and if the thickness of the silicon nitride layer 224 is too large, the overall thickness of the display panel will be relatively large.

For example, in some examples, the first electrode 226 is a transparent electrode, and the material of the first electrode 226 can include a transparent conductive material, which may include, for example, at least one of indium tin oxide (ITO), zinc tin oxide (IZO), indium gallium tin oxide (IGZO), indium zinc tin oxide (IZTO), etc. For example, the first electrode 226 can be formed on one side of the silicon nitride layer 224 away from the metal reflective layer 222 by means of magnetron sputtering. For example, the first electrode 226 is formed of ITO. Because the ITO material has a high work function (about 5.0 eV) and a high transmittance, and light can pass through the first electrode 226 almost without loss, so that the above reflective electrode structure as a whole can have a relatively high reflectivity.

For example, in some examples, the thickness of the first electrode 226 is in the range of 700-2000 Å. If the thickness of the first electrode 226 is too small, its conductive property may be poor; if the thickness of the first electrode 226 is too large, the overall thickness of the display panel will be relatively large.

For example, as shown in FIG. 1, the silicon nitride layer 224 includes a first via hole 224a, and the metal reflective layer 222 is electrically connected with the first electrode 226 through the first via hole 224a. For example, in some examples, as shown in FIG. 1, a metal member 225 is filled in the first via hole 224a, the first electrode 226 is electrically connected with the metal reflective layer 222 by aid of the metal member 225 in the via hole 224a, while the first electrode 226 is not in direct contact with the metal reflective layer 222. For example, the metal member 225 is formed of a metallic material, such as tungsten metal, and a via hole filled with metal tungsten is also called as a tungsten via-hole (W-via). For example, by using a silicon-based semiconductor process, forming a tungsten via-hole in the silicon nitride layer 224 can ensure the stability of the conductive path. Furthermore, due to the mature process of manufacturing tungsten via-holes, the obtained silicon nitride layer 224 has a good surface flatness, which is conducive to improving the reflectivity of the above reflective electrode structure.

For example, in the case where driving voltages are respectively applied to the first electrode 226 and the second electrode 228 to form a voltage difference between the first electrode 226 and the second electrode 228, the luminous functional layer 227 can emit light under action of the electric field between the first electrode 226 and the second electrode 228. For example, the luminous functional layer 227 can include any one of an organic luminous functional layer, an inorganic luminous functional layer (e.g., quantum well or the like, such as GaN/InGaN quantum well, GaAs/InGaAs quantum well, etc.), and a quantum dot luminous functional layer, etc., which are commonly known. For example, the organic luminous functional layer cam include an organic luminous layer, and can further include an electron injecting layer, an electron transporting layer, a hole injecting layer and a hole transporting layer, etc. These layers can adopt common materials and structures, and details are omitted here.

For example, in some examples, as shown in FIG. 1, the display panel further includes a defining layer (e.g., a pixel defining layer) 229 for defining the luminous functional layer 227, and the defining layer 229 defines the luminous functional layer 227 in an opening of the defining layer 229, so as to avoid mutual cross-talk between different sub-pixels. For example, the display panel can be an OLED display panel of top emission type, and the embodiments of the present disclosure include but are not limited to this case.

For example, in some examples, the second electrode 228 is a transparent electrode, so that light emitted by the luminous functional layer 227 can pass through the second electrode 228 to emit outward. For example, in some examples, the material of the second electrode 28 can include a transparent conductive material, which may include, for example, at least one of indium tin oxide (ITO), zinc tin oxide (IZO), indium gallium tin oxide (IGZO), indium zinc tin oxide (IZTO), etc.

For example, in some examples, as shown in FIG. 1, the second electrodes 228 of the light emitting element 220 in the plurality of sub-pixels are formed integrally to facilitate manufacture. The second electrodes 228 of the light emitting elements 220 in the plurality of sub-pixels are formed as an entire layer of surface electrode, and for example, formed as a second electrode layer 228.

For example, one of the first electrode 226 and the second electrode 228 can serve as an anode, and the other of the first electrode 226 and the second electrode 228 can serve as a cathode, without being limited in the embodiments of the present disclosure.

For example, in some examples, as shown in FIG. 1, each sub-pixel can further include an anti-oxidation layer 217, the anti-oxidation layer 217 is located between the base substrate 200 and the metal reflective layer 222, and the nti-oxidation layer 217 is in direct contact with the metal reflective layer 222. Thus, the anti-oxidation layer 217 can prevent the metal reflective layer 222 from being oxidized. For example, the material of the anti-oxidation layer 217 is a conductive material, such as titanium nitride (TiN), etc.

For example, as shown in FIG. 1, each sub-pixel further includes a driving circuit, and the driving circuit is located between the base substrate 200 and the metal reflective layer 222. The driving circuit is electrically connected with the light emitting element 220, and is configured to drive the light emitting element 220 to emit light. For example, as shown in FIG. 1, the driving circuit includes a driving transistor T and a storage capacitor (not shown in FIG. 1). It should be noted that, the specific circuit structure in each sub-pixel can be set according to actual needs. For example, FIG. 1 does not show all the composition of the circuit structure in each sub-pixel, and the circuit structure in each sub-pixel can further include, for example, other transistors or capacitors, etc., without being limited in the embodiments of the present disclosure.

For example, as shown in FIG. 1, the driving transistor T includes a gate electrode G, a source electrode S and a drain electrode D. These three electrodes correspond to three electrode connection portions, respectively. For example, the gate electrode G is electrically connected to a gate connection portion 210g, the source electrode S is electrically connected to a source connection portion 210s, and the drain electrode D is electrically connected to a drain connection portion 210d. For example, these three electrodes are correspondingly electrically connected with the three electrode connection portions all through tungsten via-holes 205 (referring to the above description related to tungsten via-hole).

For example, as shown in FIG. 1, the display panel further includes a second via hole 214a, and for example, the second via hole 214a can also be formed as a tungsten via-hole. For example, the drain connection portion 210d is electrically connected with the metal reflective layer 222 through the second via hole 214a, and at the same time, the metal reflective layer 222 is electrically connected with the first electrode 226 through the first via hole 224a. Therefore, an electrical connection can be formed between the drain electrode D and the first electrode 226. In the case where the driving transistor T is in a turned-on state, an electrical signal provided by a power supply line can be transmitted to the first electrode 226 through the drain electrode D of driving transistor T, the drain connection portion 210d and the metal reflective layer 222. Because a voltage difference is formed between the first electrode 226 and the second electrode 228, an electric field is formed therebetween, holes and electrons are injected into the luminous functional layer 227, and the luminous functional layer emits light under the action of the electric field. It should be understood that, in the driving transistor T, positions of the source electrode S and the drain electrode D are interchangeable (correspondingly, positions of the source connection portion 210s and the drain connection portion 210d are also interchangeable). That is, one of the source electrode S and the drain electrode D of the driving transistor is electrically connected to the metal reflective layer 222. For example, one of the source electrode S and the drain electrode D of the driving transistor is electrically connected to the metal reflective layer 222 through a second via hole 214a.

For example, in some examples, the gate electrode G of the driving transistor T is electrically connected to a storage capacitor, and for example, the gate electrode G of the driving transistor can be electrically connected to the storage capacitor through the gate connection portion 210g. For example, the storage capacitor is configured to store a data signal, so that the driving transistor T drives the light emitting element 220 to emit light based on the stored data signal.

For example, the materials of the gate connection portion 210g, the source connection portion 210s and the drain connection portion 210d can include a metallic material. For example, as shown in FIG. 1, an anti-oxidation layer 207 can be set on at least one side (e.g. upper and/or lower side) of each of the gate connection portion 210g, the source connection portion 210s and the drain connection portion 210d. In this way, oxidation of these electrode connection portions can be effectively prevented, and their conductive properties can be improved. For example, the material of the anti-oxidation layer 207 is a conductive material, such as titanium nitride (TiN), etc.

For example, as shown in FIG. 1, the display panel further includes a first encapsulation layer 232, a color filter layer 234, a second encapsulation layer 236 and a cover plate 238 that are arranged on one side of the light emitting element 220 away from the base substrate 200. For example, the first encapsulation layer 232 is located on one side of the second electrode 228 away from the base substrate 200. For example, the color filter layer 234 is located on one side of the first encapsulation layer 232 away from the base substrate 200, and includes a red filter unit R, a green filter unit G and a blue filter unit B; and for example, the light emitting element 220 is configured to emit white light, and color display can be realized when the white light passes through the color filter layer 234. For example, the second encapsulation layer 236 and the cover plate 238 are located on one side of the color filter layer 234 away from the base substrate. Specific materials of the first encapsulation layer 232, the color filter layer 234, the second encapsulation layer 236 and the cover plate 238 can be referred to the conventional materials in the prior art, and details will be omitted here.

For example, for the display panel provided by the embodiments of the present disclosure, the first electrode 226, the luminous functional layer 227 and the second electrode 228 of the light emitting element 220, as well as the first encapsulation layer 232, the color filter layer 234, the second encapsulation layer 236 and the cover plate 238 can all be manufactured on a substrate that is separately prepared; and at the same time, the silicon nitride layer 224 over the pad 215 is also etched in a panel factory, so as to expose the pad, and make it adaptable to a flexible circuit board bonding (FPC bonding) process or a wire bonding process. Therefore, in the embodiments of the present disclosure, for example, the separately prepared substrate stated above can be fabricated by a wafer factory. This substrate includes a base substrate 200 (e.g., a silicon-based base substrate), a driving circuit, a metal reflective layer 222 and a silicon nitride layer 224, and is suitable for forming a light emitting element 220 thereon, and then, other structures on the substrate are manufactured by the panel factory, thus not only reducing the manufacture difficulty of the metal reflective layer 222, but also facilitating the subsequent process of the panel factory.

Figure 2:
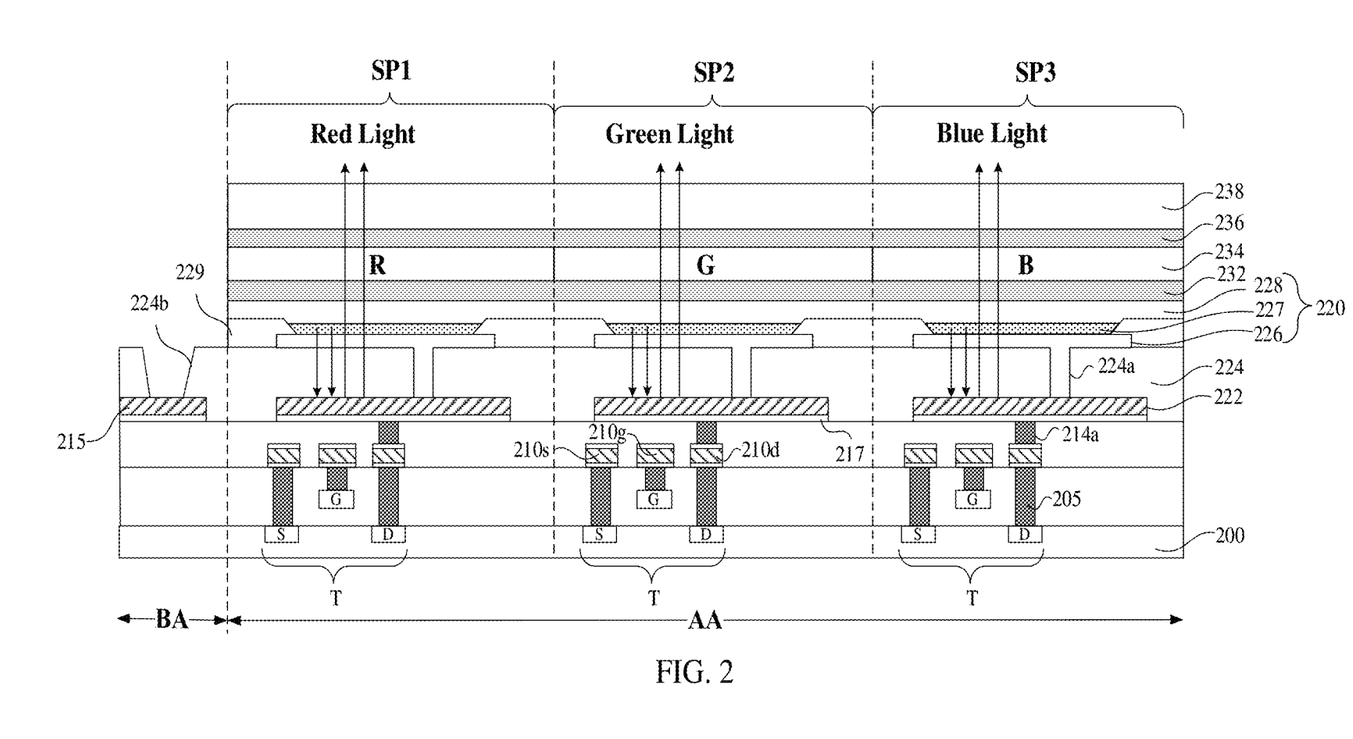
FIG. 2 is a schematic partial structural diagram of another display panel provided by at least one embodiment of the present disclosure.

FIG. 2 is a schematic partial structural diagram of another display panel provided by at least one embodiment of the present disclosure. The display panel shown in FIG. 2 differs from the display panel shown in FIG. 1 in that: the electrical connection mode of the first electrode 226 with the metal reflective layer 222 through the first via hole 224a in the silicon nitride layer 224 in display panel shown in FIG. 2 is different from the corresponding electrical connection mode in the display panel shown in FIG. 1. The arrangement of other structures in the display panel shown in FIG. 2 can be referred to the relevant description of the display panel shown in FIG. 1, and details will not be repeated here.

For example, as shown in FIG. 2, at least part of the first electrode 226 is located in the first via hole 224a and is in direct contact with the metal reflective layer 222, so that the first electrode 226 is electrically connected to the metal reflective layer 222. The manufacturing process of this connection mode is relatively simple, and because the first electrode 226 and the metal reflective layer 222 are in direct contact with each other, it is beneficial to thinning the display panel.

It should be noted that, in the display panel provided by the embodiments of the present disclosure, the first via hole 224a in the silicon nitride layer 224 can be arranged between marginal regions of the first electrode 226 and the metal reflective layer 222. For example, in some examples, both the orthographic projection of the luminous functional layer 227 on the base substrate 200 and the orthographic projection of the first via-hole 224a on the base substrate 200 are within the orthographic projection of the metal reflective layer 222 on the base substrate 200, and at the same time, there is no overlap between the orthographic projection of the luminous functional layer 227 on the base substrate 200 and the orthographic projection of the first via-hole 224a on the base substrate 200. As a result, when the metal reflective layer 222 reflects light emitted by the luminous functional layer 227, the first via-hole 224a has substantially no influence on the reflection process. It should also be noted that, the shapes and dimensions of the first electrode 226 and the metal reflective layer 222 can be set according to actual needs, without being limited in the embodiments of the present disclosure.

Figure 3:
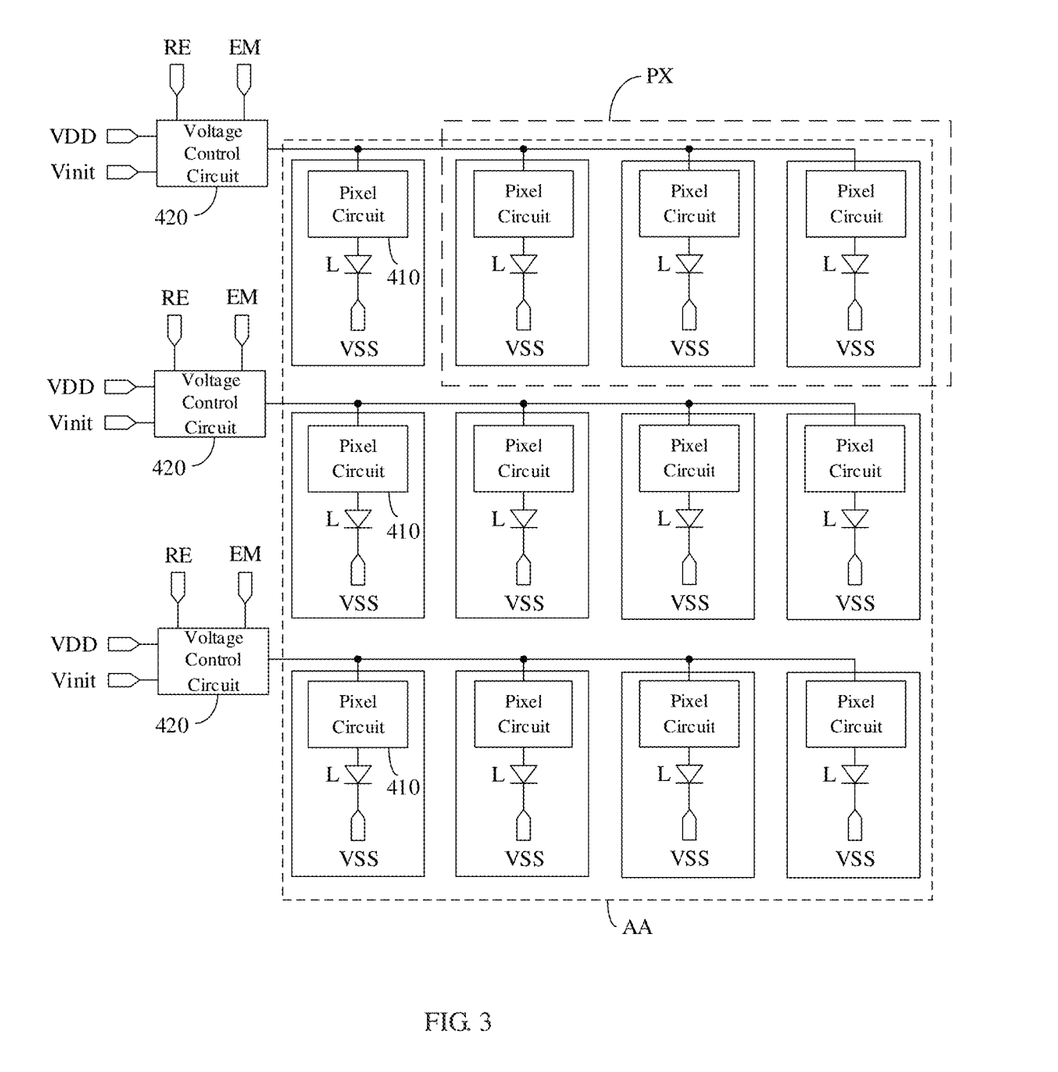
FIG. 3 is a schematic diagram illustrating a circuit principle of a display panel provided by some embodiments of the present disclosure.

FIG. 3 is a schematic diagram illustrating a circuit principle of a display panel provided by some embodiments of the present disclosure. The circuit principle shown in FIG. 3 is applicable for display panels shown in FIG. 1 and FIG. 2. For example, as shown in FIG. 3, the display panel includes a plurality of light emitting elements L (corresponding to the light emitting elements 220 shown in FIG. 1 or FIG. 2) located in a display region AA (corresponding to the display region AA shown in FIG. 1 or FIG. 2), and a plurality of pixel circuits 410 in one-to-one correspondence with the plurality of light emitting elements L. For example, the pixel circuit 410 includes a driving circuit (corresponding to the driving circuit in the embodiment shown in FIG. 1 or FIG. 2), and for example, the driving circuit includes a driving transistor (corresponding to the driving transistor T shown in FIG. 1 or FIG. 2) and a storage capacitor. Moreover, the display panel can further include a plurality of voltage control circuits 420 located in a non-display region at an outer side of the display region AA. For example, at least two pixel circuits 40 in one row share one voltage control circuit 420, and the first electrodes of the driving transistors in the pixel circuits 410 in one row are connected with the shared voltage control circuit 420, and the second electrodes of the driving transistors are connected with the corresponding light emitting elements L. A voltage control circuit 420 is configured, in response to a reset control signal RE, to output an initialization signal Vinit to the first electrode of the driving transistor, so as to control a corresponding light emitting element L to be reset; and in response to a luminous control signal EM, to output a first power signal VDD to the first electrode of the driving transistor, so as to drive the light emitting element L to emit light. By sharing the voltage control circuit 420, the structure of each pixel circuit in the display region AA can be simplified, and the occupied area of the pixel circuits in the display region AA can be reduced. Consequently, more pixel circuits and light emitting elements can be provided in the display region AA, and a display panel with a high PPI (Pixel Per Inch) can be achieved. Furthermore, the voltage control circuit 420 outputs the initialization signal Vinit to the first electrode of the driving transistor under the control of the reset control signal RE, so as to control the corresponding light emitting element to be reset, and thus, the influence of a voltage applied to the light emitting element during the light emission of a former frame, on the light emission of a latter frame can be avoided. Therefore, the afterimage phenomenon is alleviated or eliminated.

For example, the display panel can further include a plurality of pixel units PX located in the display region AA. Each of the pixel units PX includes a plurality of sub-pixels, each of which includes one light emitting element L and one pixel circuit 410. Further, each pixel unit PX can include three sub-pixels of different colors. These three sub-pixels can be a red sub-pixel, a green sub-pixel and a blue sub-pixel, respectively. Of course, the pixel unit PX can also include four, five, or more sub-pixels, which needs to be designed and determined according to the actual application scenarios, and is not limited here.

Figure 4:
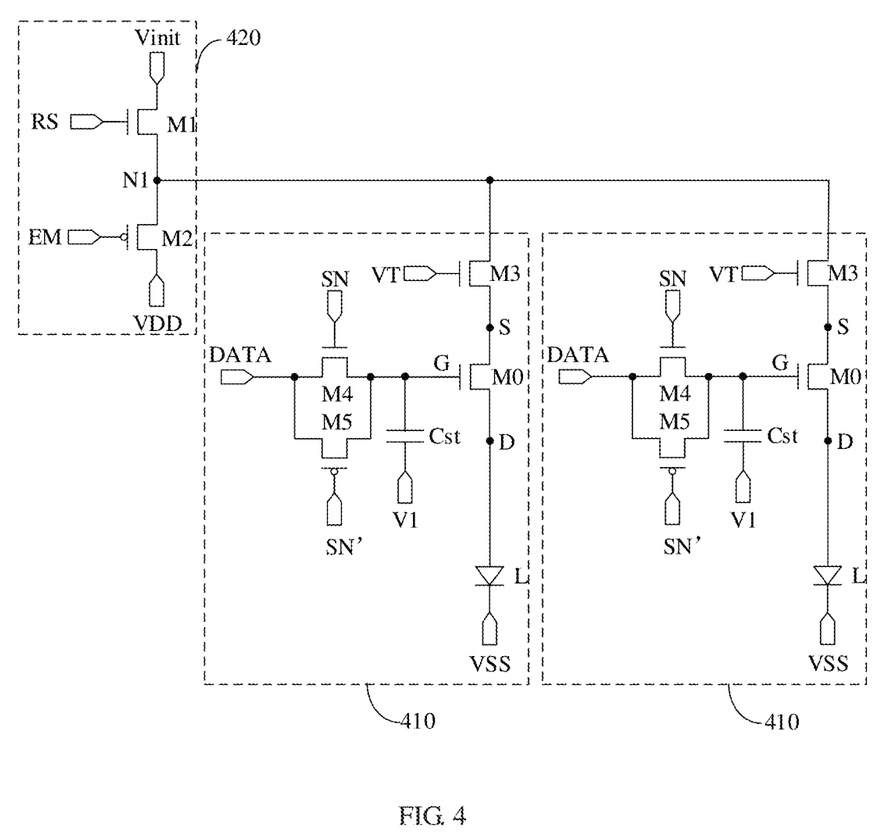
FIG. 4 is a circuit diagram illustrating a specific implementation example of a voltage control circuit and a pixel circuit in a display panel provided by some embodiments of the present disclosure.

For example, the pixel circuits 410 in at least two sub-pixels that are adjacent in the same row can be made to share one voltage control circuit 420. For example, in some examples, as shown in FIG. 4, all pixel circuits 410 in the same row can be made to share one voltage control circuit 420. Alternatively, in other examples, it is also allowed to make pixel circuits 410 in two, three or more sub-pixels that are adjacent in the same row share one voltage control circuit 420, without being limited here. Thus, the occupied area of pixel circuits in the display region AA can be reduced by sharing a voltage control circuit 420.

FIG. 4 is a circuit diagram illustrating a specific implementation example of a voltage control circuit and a pixel circuit in a display panel provided by some embodiments of the present disclosure. For example, a driving transistor M0 (corresponding to the driving transistor T shown in FIG. 1 or FIG. 2) in a pixel circuit 410 can be an N-type transistor. Moreover, a light emitting element L can include an OLED. Thus, a positive electrode of the OLED is electrically connected with a second electrode D of the driving transistor M0, and a negative electrode of the OLED is electrically connected with a second source terminal VSS. The voltage of the second source terminal VSS is generally a negative voltage or a ground voltage VGND (usually being 0 V), and the voltage of the initialization signal Vinit can also be set as the ground voltage VGND, without being limited here. The OLED can be set as a Micro-OLED or a Mini-OLED, thereby further facilitating the realization of a display panel with a high PPI.

For example, as shown in FIG. 4, the voltage control circuit 420 can include a first switching transistor M1 and a second switching transistor M2; and besides the driving transistor M0, the pixel circuit 410 can further include a third switching transistor M3, a fourth switching transistor M4, a fifth switching transistor M5, and a storage capacitor Cst.

For example, as shown in FIG. 4, a gate electrode of the first switching transistor M1 is configured to receive the reset control signal RE, a first electrode of the first switching transistor M1 is configured to receive the initialization signal Vinit, and a second electrode of the first switching transistor M1 is coupled to a first electrode of the third switching transistor M3. A gate electrode of the second switching transistor M2 is configured to receive the luminous control signal EM, a first electrode of the second switching transistor M2 is configured to receive the first power signal VDD, and a second electrode of the second switching transistor M2 is coupled to the first electrode of third switching transistor M3.

For example, the first switching transistor M1 can be made to be different from the second switching transistor in type. For example, the first switching transistor M1 is an N-type transistor and the second switching transistor M2 is a P-type transistor. Alternatively, the first switching transistor M1 is a P-type transistor and the second switching transistor M2 is an N-type transistor. Of course, the first switching transistor M1 can also be made to have the same type as the second switching transistor M2. In practical applications, the types of the first switching transistor M1 and the second switching transistor M2 needs to be designed according to the actual application scenarios, without being limited here.

For example, as shown in FIG. 4, a gate electrode of the third switching transistor M3 is configured to receives a transmission control signal VT, the first electrode of the third switching transistor M3 is coupled with the second electrode of the first switching transistor M1 and the second electrode of the second switching transistor M2, and is configured to receive the initialization signal Vinit transmitted from the first switching transistor M1 or the first power signal VDD transmitted from the second switching transistor M2, and a second electrode of the third switching transistor M3 is coupled with a first electrode S of the driving transistor M0. For example, whether the third switching transistor M3 is turned on or off can be controlled by controlling whether the transmission control signal VT is input or not, so that the illuminant time of the light emitting element L can be controlled, and further, PWM (pulse width modulation) dimming can be realized. This control mode is conducive to ensuring the uniformity of PWM control for the sub-pixels.

For example, the pixel circuit 410 can further include a fourth switching transistor M4 and a storage capacitor Cst. For example, a gate electrode of the fourth switching transistor M4 is configured to receive a gate scanning signal SN, a first electrode of the fourth switching transistor M4 is configured to receive a data signal DATA, and a second electrode of the fourth switching transistor M4 is coupled to a gate electrode G of the driving transistor M0. A first terminal of the storage capacitor Cst is coupled to the gate electrode G of the driving transistor M0, and a second terminal of the storage capacitor Cst is coupled to a first voltage terminal V1. The voltage of the first voltage terminal V1 can be the ground voltage VGND, the embodiments of the present disclosure include but are not limited to this case. For example, the storage capacitor is configured to store the data signal DATA which has been written, so that the driving transistor M0 drives the light emitting element L to emit light according to the stored data signal DATA.

For example, the pixel circuit 410 can further include a fifth switching transistor M5. For example, a gate electrode of the fifth switching transistor M5 is configured to receive an inverted signal SN' of the gate scanning signal SN, a first electrode of the fifth switching transistor M5 is configured to receive the data signal DATA, and a second electrode of the fifth switching transistor M5 is coupled to the gate electrode G of the driving transistor M0. Furthermore, the type of the fifth switching transistor M5 is different from that of the fourth switching transistor M4. For example, in some examples, as shown in FIG. 4, the fourth switching transistor M4 is an N-type transistor and the fifth switching transistor M5 is a P-type transistor; alternatively, in some other examples, the fourth switching transistor M4 is a P-type transistor and the fifth switching transistor M5 is an N-type transistor.

It should be noted that, when the voltage of the data signal DATA is a voltage corresponding to a high grayscale, for example, the fifth switching transistor M5 of the P type is turned on to transmit the data signal DATA to the gate electrode G of the driving transistor M0, so that the voltage of the data signal DATA may be avoided from being affected by a threshold voltage of the fourth switching transistor M4 of the N type. And when the voltage of the data signal DATA is a voltage corresponding to a low grayscale, for example, the fourth switching transistor M4 of the N type is turned on to transmit the data signal DATA to the gate electrode G of the driving transistor M0, so that the voltage of the data signal DATA may be avoided from being affected by a threshold voltage of the fifth switching transistor M5 of the P type. In this way, the range of the voltage input to the gate electrode G of the driving transistor M0 can be enlarged.

The driving transistor M0, the first switching transistor M1, the second switching transistor M2, the third switching transistor M3, the fourth switching transistor M4 and the fifth switching transistor M5 as mentioned above are MOS transistors manufactured on the base substrate 200 (e.g., a silicon-based base substrate).

It should be noted that, for clarity and brevity, the embodiments of the present disclosure do not present all the components of the display panel. In order to achieve basic functions of the display panel, those skilled in the art can provide and set other structures that are not shown according to specific needs, without being limited in the embodiments of the present disclosure.

For example, in the display panel provided by the embodiments of the present disclosure, the surface roughness of the reflective electrode structure formed of the metal reflective layer 222, the silicon nitride layer 224 and the first electrode 226, is relatively small. For example, the surface roughness of the reflective electrode structure can be expressed by a contour arithmetic mean deviation Ra. The contour arithmetic mean deviation Ra can be obtained by measurement with an electric profiler and calculation (the calculation process can be automatically done by the instrument). For example, the surface roughness Ra of the reflective electrode structure is less than 3.0 nm, and for example, can be 2.5 nm, 2.0 nm, 1.8 nm, 1.5 nm, etc.

Taking that the reflective electrode structure is a laminated structure of Al/SiNx/ITO as an example, and compared with a common laminated structure of Al/SiOx/ITO which is used as a reflective electrode structure, in the case where other formation conditions are the same (for example, the deposition method, deposition temperature and thickness of the Al reflective layer are the same, the deposition method, deposition temperature and thickness of the ITO layer are the same, and SiNx and SiOx have the same thickness, etc.), owing to the fact that the deposition temperature (e.g., 70-100 degrees Celsius) of SiNx is lower than the deposition temperature (e.g., 120-150 degrees Celsius) of SiOx, and the migration of Al atoms during the deposition of SiNx is not as intense as the migration of Al atoms during the deposition of SiOx, so that the degree to which the surface roughness of the Al reflective layer becomes large during the deposition of SiNx is less than the degree to which the surface roughness of the Al reflective layer becomes large during the deposition of SiOx. Furthermore, the surface roughness of the electrode structure of Al/SiNx/ITO is smaller than that of the electrode structure of Al/SiOx/ITO, that is, the reflectivity of the electrode structure of Al/SiNx/ITO is higher than that of the electrode structure of Al/SiOx/ITO.

For example, in a comparative example, the surface roughness Ra of the electrode structure of Al/SiOx/ITO is 3.5 nm, the reflectivity thereof is less than 85%; and in one example, the surface roughness Ra of the electrode structure of Al/SiNx/ITO is 1.8 nm, the reflectivity thereof is higher than 90%, and for example, the reflectivity thereof can reach 92%.

The structure including the metal reflective layer, the silicon nitride layer and the first electrode in the display panel provided by the embodiments of the present disclosure, has a relatively small surface roughness, thereby improving the reflectivity of the metal reflective layer. Thus, the light emitting efficiency and light emitting brightness of the light emitting element can be improved, and further, the display brightness of the display panel can be improved.

Figure 5:
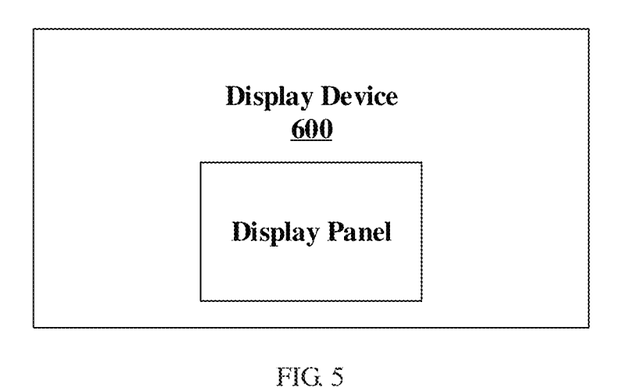
FIG. 5 is a schematic block diagram of a display device provided by at least one embodiment of the present disclosure.

At least one embodiment of the present disclosure further provides a display device. FIG. 5 is schematic block diagram of a display device provided by at least one embodiment of the present disclosure. As shown in FIG. 5, the display device 600 includes the display panel provided by any one embodiment of the present disclosure.

For example, the display device can be a silicon-based OLED display device, without being limited in the embodiments of the present disclosure.

For example, the display device can further include other components, such as a timing controller, a signal decoding circuit, a voltage conversion circuit, etc., and these components, for example, can adopt conventional components or structures, and details will be omitted here.

For example, the display device in the present embodiment can be any one product or component having a display function, such as a display panel, a display, a television, an electronic paper display device, a mobile phone, a tablet computer, a notebook computer, a digital photo frame, a navigator, a virtual reality equipment, an augmented reality equipment, etc. It should be noted that, the display device can further include other conventional components or structures. For example, for the sake of achieving necessary functions of the display device, those skilled in the art can set other conventional components or structures according to the specific application scenarios, without being limited in the embodiments of the present disclosure.

It should be noted that, for clarity and brevity, the embodiment of the present disclosure does not present all the components of the display device 600. In order to realize basic functions of the display device 600, those skilled in the art can provide and set other structures that are not shown according to specific requirements, without being limited in the embodiment of the present disclosure.

Technical effects of the display device provided by at least one embodiment of the present disclosure can be referred to the related description of the display substrate in the above embodiments, and details are omitted here.

Figure 6:
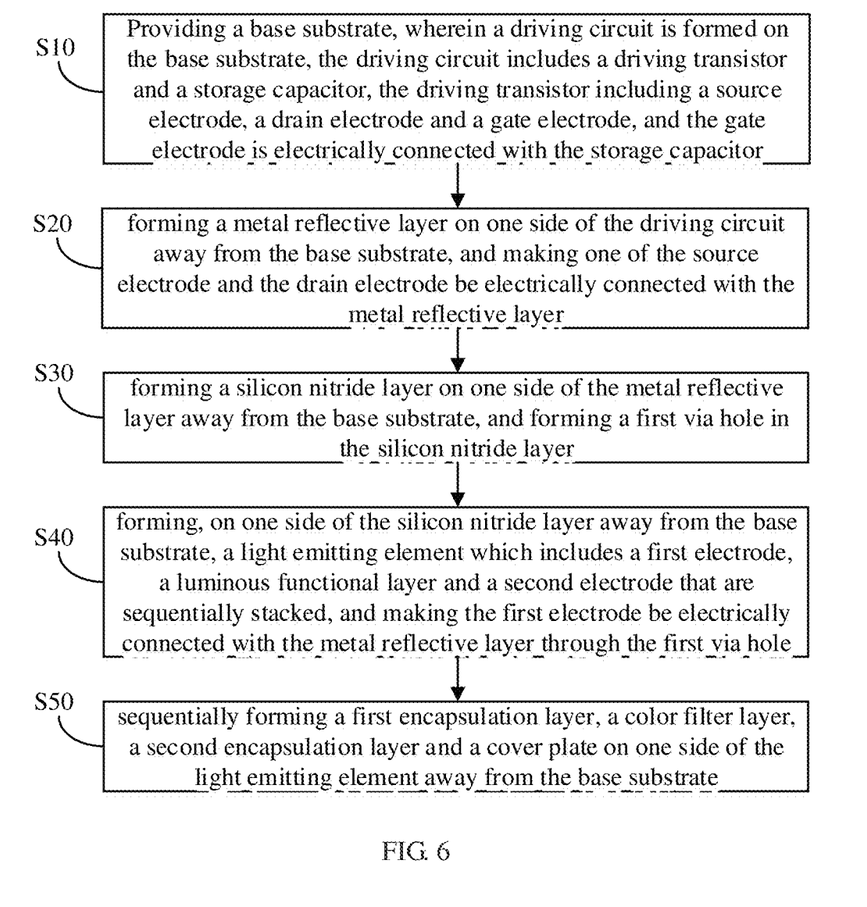
FIG. 6 is a flowchart of a manufacturing method of a display panel provided by at least one embodiment of the present disclosure.

At least an embodiment of the present disclosure further provides a manufacturing method of a display panel, and the manufacturing method can be used to manufacture the display panel provided by any one of the above embodiments. FIG. 6 is a flowchart of a manufacturing method of a display panel provided by at least one embodiment of the present disclosure.

As shown in FIG. 6, the manufacturing method of the display panel includes step S10 to step S50.

Step S10: providing a base substrate, wherein a driving circuit is formed on the base substrate, the driving circuit includes a driving transistor and a storage capacitor, the driving transistor including a source electrode, a drain electrode and a gate electrode, and the gate electrode is electrically connected with the storage capacitor.

For example, the base substrate 200 shown in FIG. 1 or FIG. 2 can be provided, but it is not limited thereto. For example, the base substrate 200 includes but is not limited to a silicon-based base substrate, etc. For example, referring to FIG. 1 or FIG. 2, a driving circuit is formed on the base substrate 200, and for example, the driving circuit includes a driving transistor T and a storage capacitor (not shown in FIGS. 1 and 2).

For example, referring to FIG. 1 or FIG. 2, the driving transistor T includes a gate electrode G, a source electrode S and a drain electrode D. These three electrodes correspond to three electrode connection portions, respectively. For example, the gate electrode G is electrically connected to a gate connection portion 210g, the source electrode S is electrically connected to a source connection portion 210s, and the drain electrode D is electrically connected to a drain connection portion 210d. For example, these three electrodes are correspondingly electrically connected with the three electrode connection portions all through tungsten via holes 205.

For example, referring to FIG. 4, the gate electrode G of the driving transistor T (i.e., the driving transistor M0 shown in FIG. 4) is electrically connected to the storage capacitor Cst. For example, the gate electrode G of the driving transistor T can be electrically connected to the storage capacitor through the gate connection portion 210g. For example, the storage capacitor is configured to store a data signal, so that the driving transistor T drives the light emitting element 220 to emit light based on the stored data signal.

For example, for more details of the structures such as the base substrate 200 and the driving circuit, etc., reference can be made to the relevant description of the base substrate and the driving circuit, etc., in the aforementioned embodiments of display panel, which will not repeated here.

Step S20: forming a metal reflective layer on one side of the driving circuit away from the base substrate, and making one of the source electrode and the drain electrode be electrically connected with the metal reflective layer.

For example, referring to FIG. 1 or FIG. 2, the metal reflective layer 222 is formed on one side of the driving circuit (i.e., the driving transistor T) away from the base substrate 200, and one of the source electrode S and the drain electrode D is made to be electrically connected with the metal reflective layer 222 through a second via hole 214a.

For example, referring to FIG. 1 or FIG. 2, the second via hole 214a can be formed firstly on one side of the driving circuit away from the base substrate 200, and for example, metal tungsten can be filled in the second via hole 214a, so that the second via hole 214 is formed to be a tungsten via-hole. For example, referring to FIG. 1 or FIG. 2, the tungsten via-hole 214a is in direct contact with the drain connection portion 210d, so as to form an electrical connection with the drain electrode D; of course, in some other examples, the tungsten via-hole 214a can also be in direct contact with the source connection portion 210s, so as to form an electrical connection with the source electrode S.

For example, referring to FIG. 1 or FIG. 2, after the above tungsten via-hole 214a is formed, the metal reflective layer 222 can be formed, and the metal reflective layer 222 is made to be in direct contact with the tungsten via-hole 214a, so as to form an electrical connection. Thus, one of the source electrode S and the drain electrode D can be electrically connected with the metal reflective layer 222 through the tungsten via-hole 214a.

For example, referring to FIG. 1 or FIG. 2, before the metal reflective layer 222 is formed, an anti-oxidation layer 217 can also be formed. The anti-oxidation layer 217 is located between the base substrate 200 and the metal reflective layer 222, and the anti-oxidation layer 217 is in direct contact with the metal reflective layer 222. Thus, the anti-oxidation layer 217 can prevent the metal reflective layer 222 from being oxidized. For example, the material of the anti-oxidation layer 217 is a conductive material, such as titanium nitride (TiN), etc. For example, the metal reflective layer 222 can be electrically connected with the tungsten via-hole 214a through the anti-oxidation layer 217.

For example, in some examples, in order to improve the reflectivity of the metal reflective layer 122, the material of the metal reflective layer 222 can include a metallic material with high reflectivity (e.g., a reflectivity of 90% or above is high reflectivity), which is, for example, a silver-containing metallic material such as silver (Ag), silver alloy or the like, or an aluminum-containing metallic material such as aluminum (Al), aluminum alloy or the like, and so on, so as to improve the reflectivity of the metal reflective layer 222 from the aspect of material. For example, the above metal reflective layer 222 can be formed by means of electron beam evaporation, etc.

For example, in some examples, the thickness of the metal reflective layer 222 is in the range of 300-500 Å, e.g. 360-450 Å. If the thickness of the metal reflective layer 222 is too small, its reflective effect is not obvious; and if the thickness of the metal reflective layer 222 is too large, the overall thickness of the display panel will be relatively large.

Step S30: forming a silicon nitride layer on one side of the metal reflective layer away from the base substrate, and forming a first via hole in the silicon nitride layer.

For example, referring to FIG. 1 or FIG. 2, a silicon nitride layer 224 can be formed on one side of the metal reflective layer 222 away from the base substrate 200, and a first via hole 224a is formed in the silicon nitride layer.

For example, in some examples, the silicon nitride layer 224 can be formed on the metal reflective layer 222 by means of vapor deposition. For example, the method of vapor deposition includes chemical vapor deposition (CVD), plasma chemical vapor deposition (PCVD), plasma enhanced chemical vapor deposition (PECVD), etc. For example, in the case where the silicon nitride layer is formed by means of vapor deposition, the deposition temperature can be relatively low (e.g., lower that the deposition temperature of silicon oxide (SiOx)). Taking that the metal reflective layer 222 is an Al reflective layer as an example, as the deposition temperature decreases, the migration of Al atoms will be inhibited, and the degree of the surface roughness of the Al reflective layer 222 becoming larger can be reduced, so as to improve the reflectivity of the metal reflective layer 222 from the aspect of structure.

For example, in some examples, referring to FIG. 1 or FIG. 2, the silicon nitride layers 224 in the plurality of sub-pixels are formed integrally to facilitate manufacture. For example, as shown in FIG. 1, the silicon nitride layer 224 can further include an opening 224b exposing a pad 215, the arrangement of the opening 224b facilitates electrical connection and signal communication between the pad 215 and an external circuit.

For example, in some examples, the deposition temperature of the silicon nitride layer 224 is, for example, in the range of 70-100 degrees Celsius, and for another example, in the range of 80-85 degrees Celsiuss.

For example, in some examples, the thickness of the silicon nitride layer 224 is in the range of 50-100 Å, e.g. 60-80 Å. If the thickness of the silicon nitride layer 224 is too small, it may not effectively realize the functions of protecting Al from being oxidized and inhibiting the migration of Al atoms; and if the thickness of the silicon nitride layer 224 is too large, the overall thickness of the display panel will be relatively large.

For example, the first via hole 224a can be formed in silicon nitride layer 224 by a photolithographic process, and the first via hole 224a is used to electrically connect the metal reflective layer 222 with a first electrode of a light emitting element which is formed subsequently. For example, the photolithographic process can be referred to the common semiconductor process, and details are omitted here.

Step S40: forming, on one side of the silicon nitride layer away from the base substrate, a light emitting element which includes a first electrode, a luminous functional layer and a second electrode that are sequentially stacked, and making the first electrode be electrically connected with the metal reflective layer through the first via hole.

For example, a light emitting element 220 can be formed on one side of the silicon nitride layer 224 away from the base substrate 200. The light emitting element 220 includes a first electrode 226, a luminous functional layer 227 and a second electrode 228 that are sequentially stacked, and the first electrode 226 is made to be electrically connected with the metal reflective layer 222 through a first via hole 224a.

For example, in some examples, firstly, a metal member 225 can be filled in the first via hole 224a. For example, the metal member 225 is formed of a metallic material, such as metal tungsten, so that the first via hole 224a is formed as a tungsten via-hole. For example, the tungsten via-hole 224a is in direct contact with the metal reflective layer 222 to form an electrical connection therebetween. Then, a first electrode 226 is formed on one side of the silicon nitride layer 224 away from the base substrate 200, and the first electrode 226 is made to be in direct contact with the tungsten via-hole 224a so as to form an electrical connection therebetween. Thus, the first electrode 226 is electrically connected to the metal reflective layer 222 through the first via hole 224a.

For example, in some examples, the first electrode 226 is a transparent electrode, and the material of the first electrode 226 can include a transparent conductive material, which may include, for example, at least one of indium tin oxide (ITO), zinc tin oxide (IZO), indium gallium tin oxide (IGZO), indium zinc tin oxide (IZTO), etc. For example, the first electrode 226 can be formed on one side of the silicon nitride layer 224 away from the metal reflective layer 222 by means of magnetron sputtering. For example, the first electrode 226 is formed of ITO. Because the ITO material has a high work function (about 5.0 eV) and a high transmittance, and light can pass through the first electrode 226 almost without loss, so that the reflective electrode structure formed of the metal reflective layer 222, the silicon nitride layer 224 and the first electrode 226 as a whole can have a relatively high reflectivity.

For example, in some examples, the thickness of the first electrode 226 is in the range of 700-2000 Å. If the thickness of the first electrode 226 is too small, its conductive property may be poor; if the thickness of the first electrode 226 is too large, the overall thickness of the display panel will be relatively large.

For example, after the first electrode 226 is formed, a luminous functional layer 227 can be then formed on one side of the first electrode 226 away from the base substrate 220. For example, the luminous functional layer 227 can include any one of an organic luminous functional layer, an inorganic luminous functional layer (e.g., quantum well or the like, such as GaN/InGaN quantum well, GaAs/InGaAs quantum well, etc.), and a quantum dot luminous functional layer, etc., which are commonly known. For example, the organic luminous functional layer cam include an organic luminous layer, and can further include an electron injecting layer, an electron transporting layer, a hole injecting layer and a hole transporting layer, etc. These layers can adopt common materials and structures, and details are omitted here.

For example, after the luminous functional layer 227 is formed, a second electrode 228 can be then formed on one side of the luminous functional layer 227 away from the base substrate 220. For example, in some examples, the second electrode 228 is a transparent electrode, so that light emitted by the luminous functional layer 227 can pass through the second electrode 228 to emit outward. For example, in some examples, the material of the second electrode 28 can include a transparent conductive material, which may include, for example, at least one of indium tin oxide (ITO), zinc tin oxide (IZO), indium gallium tin oxide (IGZO), indium zinc tin oxide (IZTO), etc.

For example, in some examples, referring to FIG. 1 or FIG. 2, the second electrodes 228 of the light emitting element 220 in the plurality of sub-pixels are formed integrally to facilitate manufacture. The second electrodes 228 of the light emitting elements 220 in the plurality of sub-pixels are formed as an entire layer of surface electrode, and for example, formed as a second electrode layer 228.

For example, in the case where driving voltages are respectively applied to the first electrode 226 and the second electrode 228 to form a voltage difference between the first electrode 226 and the second electrode 228, the luminous functional layer 227 can emit light under action of the electric field between the first electrode 226 and the second electrode 228.

Step S50: sequentially forming a first encapsulation layer, a color filter layer, a second encapsulation layer and a cover plate on one side of the light emitting element away from the base substrate.

For example, referring to FIG. 1 or FIG. 2, a first encapsulation layer 232, a color filter layer 234, a second encapsulation layer 236 and a cover plate 238 can be sequentially formed on one side of the light emitting element 220 away from the base substrate 220. For example, the first encapsulation layer 232 is located on one side of the second electrode layer 228 away from the base substrate 200. For example, the color filter layer 234 is located on one side of the first encapsulation layer 232 away from the base substrate 200, and includes a red filter unit R, a green filter unit G and a blue filter unit B; and for example, the light emitting element 220 is configured to emit white light, and color display can be realized when the white light passes through the color filter layer 234. For example, the second encapsulation layer 236 and the cover plate 238 are located on one side of the color filter layer 234 away from the base substrate. Specific materials of the first encapsulation layer 232, the color filter layer 234, the second encapsulation layer 236 and the cover plate 238 can be referred to the conventional materials in the prior art, and details will be omitted here. It should be noted that, in some examples, the light emitting elements in the plurality of sub-pixels can emit light of three colors, such as red light, green light and blue light, respectively. In this case, the above color filter layer may not be formed.

For example, for the display panel provided by the embodiments of the present disclosure, the first electrode 226, the luminous functional layer 227 and the second electrode 228 of the light emitting element 220, as well as the first encapsulation layer 232, the color filter layer 234, the second encapsulation layer 236 and the cover plate 238 can all be manufactured on a substrate that is separately prepared; and at the same time, the silicon nitride layer 224 over the pad 215 is also etched in a panel factory, so as to expose the pad, and make it adaptable to a flexible circuit board bonding (FPC bonding) process or a wire bonding process. Therefore, in the embodiments of the present disclosure, for example, the separately prepared substrate stated above can be fabricated by a wafer factory. This substrate includes a base substrate 200 (e.g., a silicon-based base substrate), a driving circuit, a metal reflective layer 222 and a silicon nitride layer 224, and is suitable for forming a light emitting element 220 thereon, and then, other structures on the substrate are manufactured by the panel factory, thus not only reducing the manufacture difficulty of the metal reflective layer 222, but also facilitating the subsequent process of the panel factory.

For example, in the display panel manufactured by using the above manufacturing method, the surface roughness of the reflective electrode structure formed of the metal reflective layer 222, the silicon nitride layer 224 and the first electrode 226, is relatively small. For example, the surface roughness of the reflective electrode structure can be expressed by a contour arithmetic mean deviation Ra. The contour arithmetic mean deviation Ra can be obtained by measurement with an electric profiler and calculation (the calculation process can be automatically done by the instrument). For example, the surface roughness Ra of the reflective electrode structure is less than 3.0 nm, and for example, can be 2.5 nm, 2.0 nm, 1.8 nm, 1.5 nm, etc.

Taking that the reflective electrode structure is a laminated structure of Al/SiNx/ITO as an example, and compared with a common laminated structure of Al/SiOx/ITO which is used as a reflective electrode structure, in the case where other formation conditions are the same (for example, the deposition method, deposition temperature and thickness of the Al reflective layer are the same, the deposition method, deposition temperature and thickness of the ITO layer are the same, and SiNx and SiOx have the same thickness, etc.), owing to the fact that the deposition temperature (e.g., 70-100 degrees Celsius) of SiNx is lower than the deposition temperature (e.g., 120-150 degrees Celsius) of SiOx, and the migration of Al atoms during the deposition of SiNx is not as intense as the migration of Al atoms during the deposition of SiOx, so that the degree to which the surface roughness of the Al reflective layer becomes large during the deposition of SiNx is less than the degree to which the surface roughness of the Al reflective layer becomes large during the deposition of SiOx. Furthermore, the surface roughness of the electrode structure of Al/SiNx/ITO is smaller than that of the electrode structure of Al/SiOx/ITO, that is, the reflectivity of the electrode structure of Al/SiNx/ITO is higher than that of the electrode structure of Al/SiOx/ITO.

For example, in a comparative example, the surface roughness Ra of the electrode structure of Al/SiOx/ITO is 3.5 nm, the reflectivity thereof is less than 85%; and in one example, the surface roughness Ra of the electrode structure of Al/SiNx/ITO is 1.8 nm, the reflectivity thereof is higher than 90%, and for example, the reflectivity thereof can reach 92%.

Technical effects of the manufacturing method of the display panel provided by the embodiments of the present disclosure can be referred to the related description of the display panel in the above embodiments, and details are omitted here.

For the disclosure, the following statements should be noted:

(1) The accompanying drawings related to the embodiment(s) of the present disclosure involve only the structure(s) in connection with the embodiment(s) of the present disclosure, and other structure(s) can be referred to common design(s).

(2) For the purpose of clarity only, in accompanying drawings for illustrating the embodiment(s) of the present disclosure, the thickness and size of a layer or a structure may be enlarged or narrowed, that is, the drawings are not drawn in a real scale.

(3) In case of no conflict, the embodiments of the present disclosure and the features in the embodiments can be combined with each other to obtain new embodiments.

What have been described above are only specific implementations of the present disclosure, and the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be determined based on the protection scope of the claims.

What is claimed is:

1. A display panel, comprising a base substrate and a plurality of sub-pixels on one side of the base substrate, wherein at least one of the plurality of sub-pixels comprises:
    a light emitting element, comprising a first electrode, a luminous functional layer and a second electrode that are sequentially stacked, wherein the first electrode is closer to the base substrate than the second electrode;
    a metal reflective layer between the base substrate and the first electrode;
    a silicon nitride layer between the first electrode and the metal reflective layer, wherein the silicon nitride layer is in direct contact with the metal reflective layer, the silicon nitride layer comprises a first via hole, and the first electrode is electrically connected with the metal reflective layer through the first via hole; and
    a driving circuit between the base substrate and the metal reflective layer, wherein the driving circuit comprises a driving transistor and a storage capacitor, the driving transistor comprises a source electrode, a drain electrode and a gate electrode, one of the source electrode and the drain electrode is electrically connected with the metal reflective layer, the gate electrode is electrically connected with the storage capacitor, and the storage capacitor is configured to store a data signal.

2. The display panel according to claim 1, wherein a deposition temperature of the silicon nitride layer is in the range of 70-100 degrees Celsius.

3. The display panel according to claim 2, wherein the deposition temperature of the silicon nitride layer is in a range of 80-85 degrees Celsius.

4. The display panel according to claim 1, wherein a thickness of the silicon nitride layer is in a range of 50-100 Å.

5. The display panel according to claim 1, wherein a material of the metal reflective layer comprises a metallic material containing silver or aluminum.

6. The display panel according to claim 1, wherein a thickness of the metal reflective layer is in a range of 300-500 Å.

7. The display panel according to claim 1, wherein the first electrode is a transparent electrode.

8. The display panel according to claim 7, wherein a material of the first electrode comprises at least one selected from the group consisting of indium tin oxide (ITO), zinc tin oxide (IZO), indium gallium tin oxide (IGZO), and indium zinc tin oxide (IZTO).

9. The display panel according to claim 1, wherein a thickness of the first electrode is in a range of 700-2000 Å.

10. The display panel according to claim 1, wherein a structure comprising the metal reflective layer, the silicon nitride layer and the first electrode, has a surface roughness of less than 3.0 nm.

11. The display panel according to claim 1, wherein the second electrode is a transparent electrode.

12. The display panel according to claim 1, further comprising: a first encapsulation layer, a color filter layer, a second encapsulation layer and a cover plate that are sequentially stacked and on one side of the light emitting element away from the base substrate.

13. The display panel according to claim 12, wherein the light emitting element is configured to emit white light, and the color filter layer comprises a red filter unit, a green filter unit and a blue filter unit.

14. The display panel according to claim 1, wherein the base substrate is a silicon-based base substrate.

15. The display panel according to claim 1, further comprising a second via hole, wherein the one of the source electrode and the drain electrode is electrically connected with the metal reflective layer through the second via hole.

16. The display panel according to claim 1, further comprising an anti-oxidation layer, wherein the anti-oxidation layer is between the base substrate and the metal reflective layer, and the anti-oxidation layer is in direct contact with the metal reflective layer.

17. A display device, comprising a display panel, wherein the display panel comprises a base substrate and a plurality of sub-pixels on one side of the base substrate, and
    at least one of the plurality of sub-pixels comprises:
        a light emitting element, comprising a first electrode, a luminous functional layer and a second electrode that are sequentially stacked, wherein the first electrode is closer to the base substrate than the second electrode;
        a metal reflective layer between the base substrate and the first electrode;
        a silicon nitride layer between the first electrode and the metal reflective layer, wherein the silicon nitride layer is in direct contact with the metal reflective layer, the silicon nitride layer comprises a first via hole, and the first electrode is electrically connected with the metal reflective layer through the first via hole; and
        a driving circuit between the base substrate and the metal reflective layer, wherein the driving circuit comprises a driving transistor and a storage capacitor, the driving transistor comprises a source electrode, a drain electrode and a gate electrode, one of the source electrode and the drain electrode is electrically connected with the metal reflective layer, the gate electrode is electrically connected with the storage capacitor, and the storage capacitor is configured to store a data signal.

18. A manufacturing method of a display panel, comprising:
    providing a base substrate, wherein a driving circuit is formed on the base substrate, the driving circuit comprises a driving transistor and a storage capacitor, the driving transistor comprises a source electrode, a drain electrode and a gate electrode, and the gate electrode is electrically connected with the storage capacitor;
    forming a metal reflective layer on one side of the driving circuit away from the base substrate, and making one of the source electrode and the drain electrode be electrically connected with the metal reflective layer;

forming a silicon nitride layer on one side of the metal reflective layer away from the base substrate, and forming a first via hole in the silicon nitride layer; and forming, on one side of the silicon nitride layer away from the base substrate, a light emitting element which comprises a first electrode, a luminous functional layer and a second electrode that are sequentially stacked, and making the first electrode be electrically connected with the metal reflective layer through the first via hole.

19. The manufacturing method according to claim 18, further comprising:

forming a second via hole on one side of the driving circuit away from the base substrate, before the forming the metal reflective layer on one side of the driving circuit away from the base substrate;

wherein the one of the source electrode and the drain electrode is electrically connected with the metal reflective layer through the second via hole.

20. The manufacturing method according to claim 18, further comprising:

sequentially forming a first encapsulation layer, a color filter layer, a second encapsulation layer and a cover plate on one side of the light emitting element away from the base substrate.

\* \* \* \* \*